(12) United States Patent
Holt et al.

(10) Patent No.: US 7,113,407 B2
(45) Date of Patent: *Sep. 26, 2006

(54) LOW PROFILE EXPANSION CARD RETAINING CLIP

(75) Inventors: George T. Holt, Round Rock, TX (US); Brandon Brocklesby, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/120,917

(22) Filed: May 3, 2005

(65) Prior Publication Data

US 2005/0191870 A1 Sep. 1, 2005

Related U.S. Application Data

(63) Continuation of application No. 10/736,276, filed on Dec. 15, 2003, now Pat. No. 6,920,048.

(51) Int. Cl.
*G06F 1/16* (2006.01)
*A47B 47/00* (2006.01)

(52) U.S. Cl. .............. 361/726; 361/752; 312/265.6; 211/41.17

(58) Field of Classification Search ........ 361/724–727, 361/679–687, 728, 732, 740–741, 752–753, 361/800–802, 756, 789; 312/223.1–223.3, 312/216, 265.6; 211/41.17, 26
See application file for complete search history.

(56) References Cited

U.S. PATENT DOCUMENTS

| 5,601,349 | A | 2/1997 | Holt ................... 312/265.6 |
| 5,748,453 | A | 5/1998 | Carney et al. .......... 361/801 |
| 6,069,796 | A | 5/2000 | Hastings et al. ........ 361/754 |
| 6,138,389 | A | 10/2000 | Kanazawa et al. .......... 38/93 |
| 6,173,843 | B1 * | 1/2001 | Christensen et al. ..... 211/41.17 |
| 6,195,262 | B1 | 2/2001 | Bodette et al. .......... 361/752 |
| 6,215,668 | B1 | 4/2001 | Hass et al. ............ 361/759 |
| 6,430,056 | B1 | 8/2002 | Chen ................... 361/759 |
| 6,487,089 | B1 | 11/2002 | Otis ................... 361/796 |
| 6,499,198 | B1 | 12/2002 | Eckenrode ............... 24/295 |
| 6,704,205 | B1 | 3/2004 | Chen ................... 361/740 |
| 6,809,922 | B1 | 10/2004 | Lin et al. ............. 361/683 |
| 6,920,048 | B1 * | 7/2005 | Holt et al. ............ 361/726 |
| 2004/0184252 | A1 | 9/2004 | Lin et al. ............. 361/801 |

* cited by examiner

*Primary Examiner*—Hung Van Duong
(74) *Attorney, Agent, or Firm*—Baker Botts L.L.P.

(57) ABSTRACT

A low profile expansion card retaining clip is disclosed. In one aspect, the present disclosure teaches a chassis component forming a part of a chassis including a panel having an aperture formed therein. The aperture maintains access to a computer component. The computer component has a bracket. A frame formed adjacent the aperture receives a portion of the bracket. A retaining clip movably couples to the frame such that the retaining clip moves between an engaged position and a disengaged position. The retaining clip oriented and designed to permit airflow through the frame. A spring member operably extending from a portion of the retaining clip, the spring member operably engages the bracket to secure the computer component to the chassis component in the engaged position and operably permits removal and installation of the computer component in the disengaged position.

20 Claims, 6 Drawing Sheets

LOW PROFILE EXPANSION CARD RETAINING CLIP

CROSS REFERENCE TO RELATED APPLICATIONS

This application is a continuation of U.S. patent application Ser. No. 10/736,276 filed Dec. 15, 2003, and entitled "Low Profile Expansion Card Retaining Clip" now U.S. Pat. No. 6,920,048.

TECHNICAL FIELD

The present disclosure relates generally to information handling systems and, more particularly, to a low profile expansion card retaining clip.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Due to consumer demand for smaller and more powerful information handling systems, manufacturers strive to implement new methods to meet these demands. One such method includes the development of a low profile information handling system, such as a IU server.

A IU server is typically designed to fit within the confines of a rack or rack system, such that another device may be placed above and below the IU server in the rack. The vertical space within the rack system is generally defined in vertical mounting unit increments, often referred to as "U's". A mounting unit or "U" is typically 1.75 inches. Thus, the IU server refers to a server designed to fit within a confined space of a rack with a height of IU or approximately 1.75 inches.

Placing a server within a restricted area creates problems with heat dissipation. Typically, servers use an air cooling system to establish airflow though the unit for cooling or ventilation. Because of the limited space within a server, manufacturers have thermal design concerns when designing locations for server components such as a Peripheral Component Interface (PCI) card that may obstruct the airflow.

Due in part to the restricted space and thermal design concerns, PCI cards are typically mounted in a horizontal position at the back of the server. In the horizontal position, the use of conventional screws to retain the card in the server was not feasible. Thus, manufacturers designed alternative methods to attach the cards to the server chassis. However, many of the methods utilize metal brackets made for sheet metal or large plastic retainers that restrict airflow through the server.

SUMMARY

Thus, a need has arisen for a low profile retaining clip.

In accordance with teachings of the present disclosure, in some embodiments, a chassis component forming a part of a chassis including a panel having an aperture formed therein. The aperture maintains access to a computer component. The computer component has a bracket. A frame formed adjacent the aperture receives a portion of the bracket. A retaining clip movably couples to the frame such that the retaining clip moves between an engaged position and a disengaged position. The retaining clip oriented and designed to permit airflow through the frame. A spring member operably extending from a portion of the retaining clip, the spring member operably engages the bracket to secure the computer component to the chassis component in the engaged position and operably permits removal and installation of the computer component in the disengaged position.

In other embodiments, an information handling system includes a chassis, a printed circuit board, at least one processor, and a memory. The chassis forming part of the structure of the information handling system includes a chassis component. The chassis component includes a panel having an aperture formed therein. The aperture maintains access to a computer component. The computer component has a bracket. A frame formed adjacent the aperture receives a portion of the bracket. A retaining clip movably coupled to the frame such that the retaining clip moves between an engaged position and a disengaged position. The retaining clip oriented and designed to permit airflow through the frame. A spring member operably extending from a portion of the retaining clip, the spring member operably engages the bracket to secure the computer component to the chassis component in the engaged position and operably permits removal and installation of the computer component in the disengaged position. The printed circuit board has a computer component slot. The computer component slot operable to electrically couple the computer component to the printed circuit board. The at least one processor operably couples to the printed circuit board. The memory operably couples to the processor and the printed circuit board.

In further embodiments, a chassis component for securing a computer component includes a frame forming a portion of a chassis component. The frame operably receives a portion of bracket from a computer component. A retaining clip has a spring member. The retaining clip movably coupled to the frame such that the retaining clip moves between an engaged position and a disengaged position. The spring member operably engages the bracket to secure the computer component to the chassis component in the engaged position and operably permits removal and installation of the computer component in the disengaged position. A guide slot formed along one side of the frame. A guide rail formed on the retaining clip, the guide rail operably slidable within the guide slot when the retaining clip moves between the engaged position and the disengaged position.

In one aspect, teachings of the present disclosure provide the technical advantage of permitting additional air flow through the information handling system. Because of the low profile design of the retaining clip, cooling air moving through the information handling system may flow past the retaining clip through additional vent holes provided in the chassis of the system.

In another aspect, teachings of the present disclosure provide the technical advantage of installing an expansion card is performed without the aid of tools.

Further, teachings of the present disclosure provide the technical advantages of a low-cost, simple, and efficient method of installing an expansion card in an information handling system.

All, some, or none of these technical advantages may be present in various embodiments of the present invention. Other technical advantages will be apparent to one skilled in the art from the following figures, descriptions, and claims.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 8, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
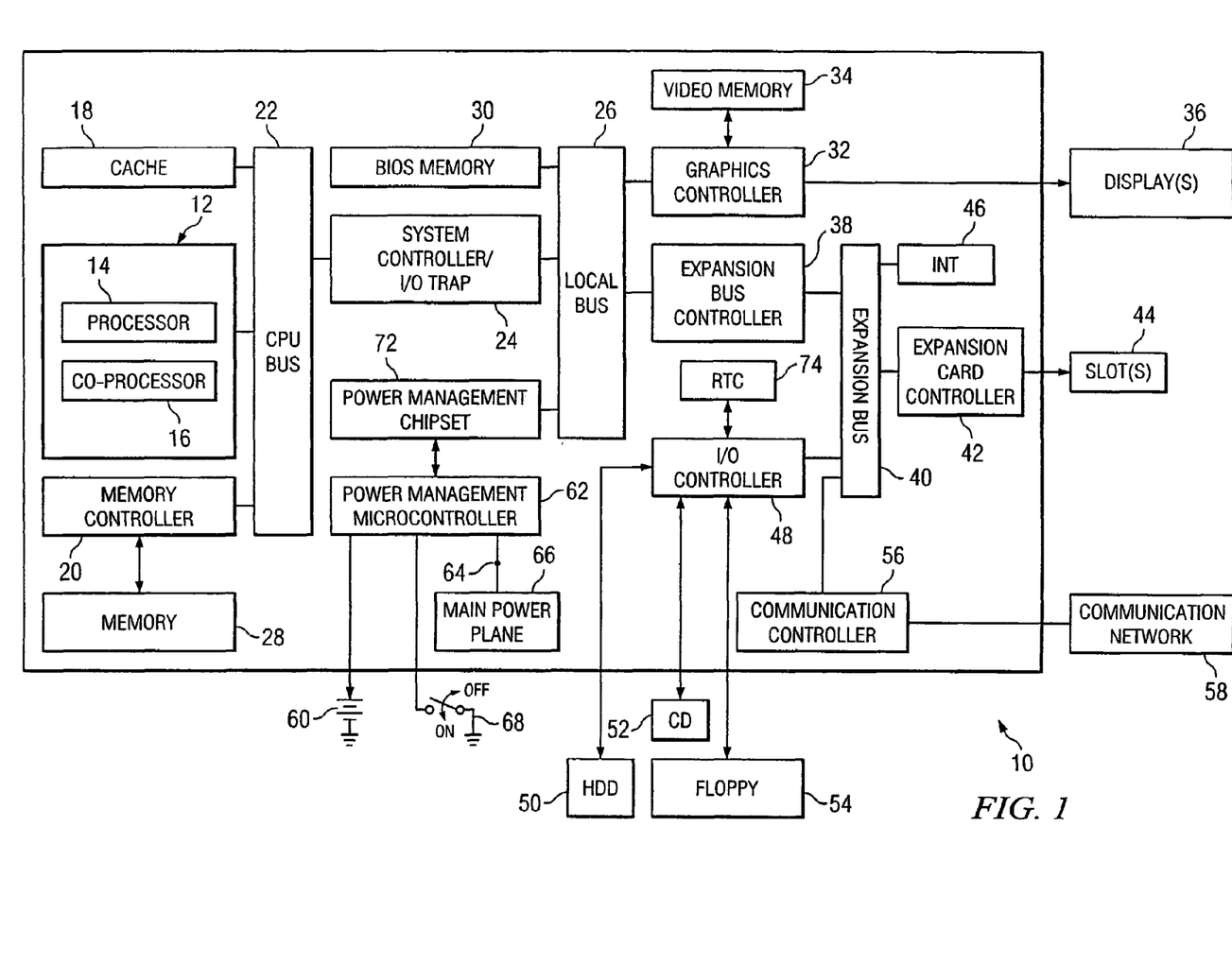
FIG. 1 is a block diagram showing an information handling system including an expansion card, according to teachings of the present disclosure.

Referring first to FIG. 1, a block diagram of information handling system 10 is shown, according to teachings of the present disclosure. Information handling system 10 or computer system preferably includes at least one microprocessor or central processing unit (CPU) 12. CPU 12 may include processor 14 for handling integer operations and coprocessor 16 for handling floating point operations. CPU 12 is preferably coupled to cache 18 and memory controller 20 via CPU bus 22. System controller I/O trap 24 preferably couples CPU bus 22 to local bus 26 and may be generally characterized as part of a system controller.

Main memory 28 of dynamic random access memory (DRAM) modules is preferably coupled to CPU bus 22 by a memory controller 20. Main memory 28 may be divided into one or more areas such as system management mode (SMM) memory area (not expressly shown).

Basic input/output system (BIOS) memory 30 is also preferably coupled to local bus 26. FLASH memory or other nonvolatile memory may be used as BIOS memory 30. A BIOS program (not expressly shown) is typically stored in BIOS memory 30. The BIOS program preferably includes software which facilitates interaction with and between information handling system 10 devices such as a keyboard (not expressly shown), a mouse (not expressly shown), or one or more I/O devices. BIOS memory 30 may also store system code (note expressly shown) operable to control a plurality of basic information handling system 10 operations.

Graphics controller 32 is preferably coupled to local bus 26 and to video memory 34. Video memory 34 is preferably operable to store information to be displayed on one or more display panels 36. Display panel 36 may be an active matrix or passive matrix liquid crystal display (LCD), a cathode ray tube (CRT) display or other display technology. In selected applications, uses or instances, graphics controller 32 may also be coupled to an integrated display, such as in a portable information handling system implementation.

Bus interface controller or expansion bus controller 38 preferably couples local bus 26 to expansion bus 40. In one embodiment, expansion bus 40 may be configured as an Industry Standard Architecture ("ISA") bus. Other buses, for example, a Peripheral Component Interconnect ("PCI") bus, may also be used.

Interrupt request generator 46 is also preferably coupled to expansion bus 40. Interrupt request generator 46 is preferably operable to issue an interrupt service request over a predetermined interrupt request line in response to receipt of a request to issue interrupt instruction from CPU 12.

I/O controller 48, often referred to as a super I/O controller, is also preferably coupled to expansion bus 40. I/O controller 48 preferably interfaces to an integrated drive electronics (IDE) hard drive device (HDD) 50, CD-ROM (compact disk-read only memory) drive 52 and/or a floppy disk drive (FDD) 54. Other disk drive devices (not expressly shown) which may be interfaced to the I/O controller include a removable hard drive, a zip drive, a CD-RW (compact disk-read/write) drive, and a CD-DVD (compact disk—digital versatile disk) drive.

Communication controller 56 is preferably provided and enables information handling system 10 to communicate with communication network 58, e.g., an Ethernet network. Communication network 58 may include a local area network (LAN), wide area network (WAN), Internet, Intranet, wireless broadband or the like. Communication controller 56 may be employed to form a network interface for communicating with other information handling systems (not expressly shown) coupled to communication network 58.

As illustrated, information handling system 10 preferably includes power supply 60, which provides power to the many components and/or devices that form information handling system 10. Power supply 60 may be a rechargeable battery, such as a nickel metal hydride ("NiMH") or lithium ion battery, when information handling system 10 is embodied as a portable or notebook computer, an A/C (alternating current) power source, an uninterruptible power supply (UPS) or other power source.

Power supply 60 is preferably coupled to power management microcontroller 62. Power management microcontroller 62 preferably controls the distribution of power from power supply 60. More specifically, power management microcontroller 62 preferably includes power output 64 coupled to main power plane 66 which may supply power to CPU 12 as well as other information handling system components. Power management microcontroller 62 may also be coupled to a power plane (not expressly shown) operable to supply power to an integrated panel display (not expressly shown), as well as to additional power delivery planes preferably included in information handling system 10.

Power management microcontroller 62 preferably monitors a charge level of an attached battery or UPS to determine when and when not to charge the battery or UPS. Power management microcontroller 62 is preferably also coupled to main power switch 68, which the user may actuate to turn information handling system 10 on and off. While power management microcontroller 62 powers down one or more portions or components of information handling system 10, e.g., CPU 12, display 36, or HDD 50, etc., when not in use to conserve power, power management microcontroller 62 itself is preferably substantially always coupled to a source of power, preferably power supply 60.

Computer system 10 may also include power management chip set 72. Power management chip set 72 is preferably coupled to CPU 12 via local bus 26 so that power management chip set 72 may receive power management and control commands from CPU 12. Power management chip set 72 is preferably connected to a plurality of individual power planes operable to supply power to respective components of information handling system 10, e.g., HDD 50, FDD 54, etc. In this manner, power management chip set 72 preferably acts under the direction of CPU 12 to control the power supplied to the various power planes and components of a system.

Real-time clock (RTC) 74 may also be coupled to I/O controller 48 and power management chip set 72. Inclusion of RTC 74 permits timed events or alarms to be transmitted to power management chip set 72. Real-time clock 74 may be programmed to generate an alarm signal at a predetermined time as well as to perform other operations.

In certain information handling system embodiments, expansion card controller 42 may also be included and is preferably coupled to expansion bus 40 as shown. Expansion card controller 42 is preferably coupled to a plurality of information handling system expansion slots 44. Expansion slots 44 may be configured to receive one or more computer components 80 (shown below in more detail) such as an expansion card (e.g., modems, fax cards, communications cards, and other input/output (I/O) devices). In order to secure computer component 80 to information handling system 10, chassis component 128 (shown below in more detail) forming a part of the chassis of information handling system 10 includes low profile retaining clip 90 (shown below in more detail) such that additional airflow moves through information handling system 10 via chassis component 128.

Figures 2, 3A, 3B:
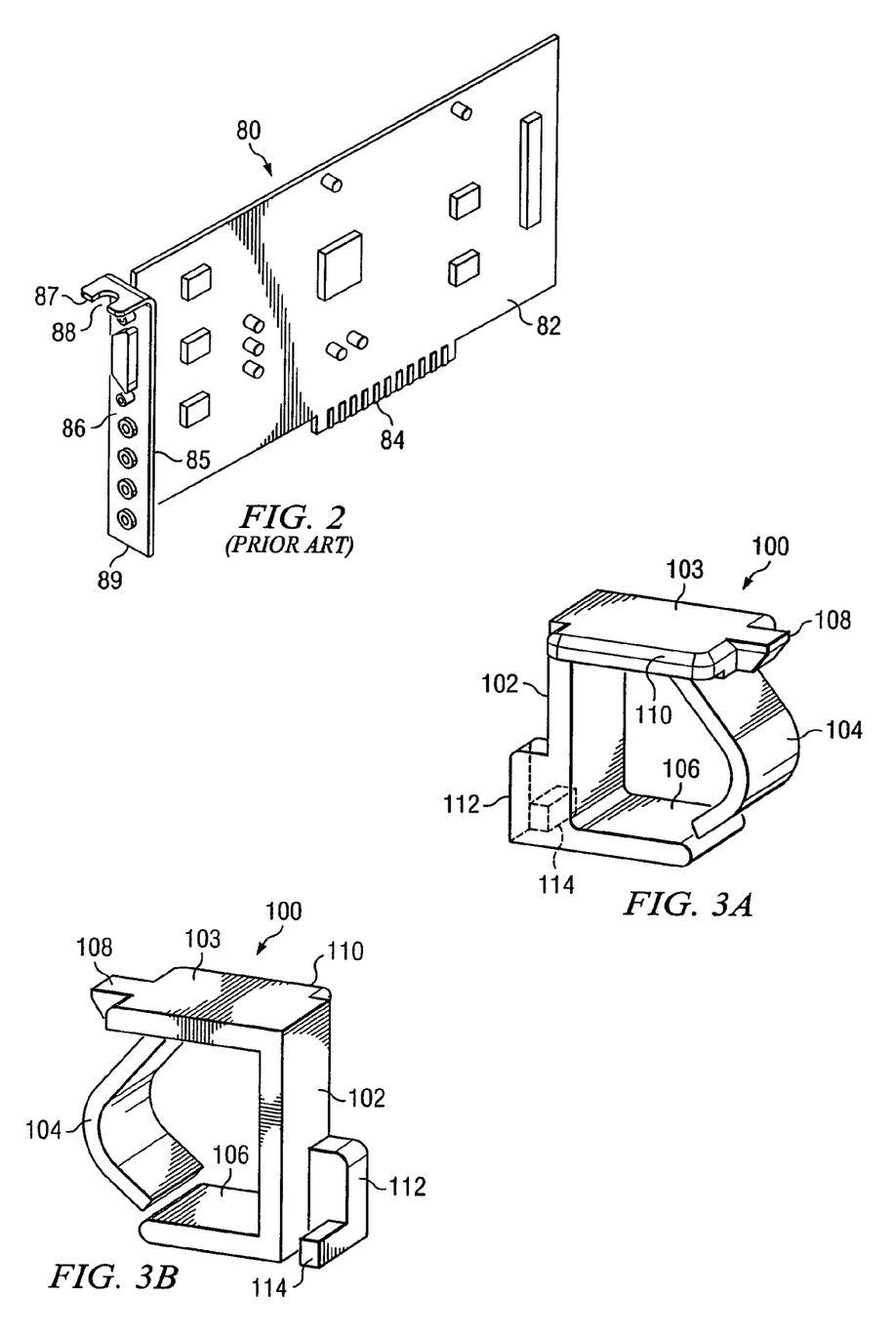
FIG. 2 illustrates a perspective view of a computer component.
FIGS. 3A and 3B illustrate perspective views of a retaining clip, according to teachings of the present disclosure.

FIG. 2 illustrates a perspective view of computer component 80. Computer component 80 includes a printed circuit board such as expansion board 82 that is electrically coupled to expansion slot 44 via connector 84. One example of computer component 80 is a peripheral component interface (PCI) card. Computer component 80 uses bracket 85 for coupling to a portion of information handling system 10 such as coupling to chassis component 128.

To aid in coupling, bracket 85 includes flange 87 with screw slot 88 that facilitates to connect computer component 80 to the chassis of information handling system 10. Bracket 85 may also use lower portion 89 to couple to a second point on the chassis to further couple to the chassis. In some instances, bracket 85 includes I/O ports 86 formed on bracket 85. In some instances, bracket 85 may be used alone without expansion board 82 such as a cover plate used for shipping purposes or other purposes.

FIGS. 3A and 3B illustrate perspective views of retaining clip 100. Low profile retaining clips such as retaining clip 100 couples to chassis component 128 at frame 120 (shown below in more detail). The low profile design permits airflow through retaining clip 100 when coupled to frame 120. In some embodiments, low profile retaining clip such as retaining clip 100 is made from plastic, metal, any suitable material to couple with chassis component 128, or any combination thereof.

Figure 4:
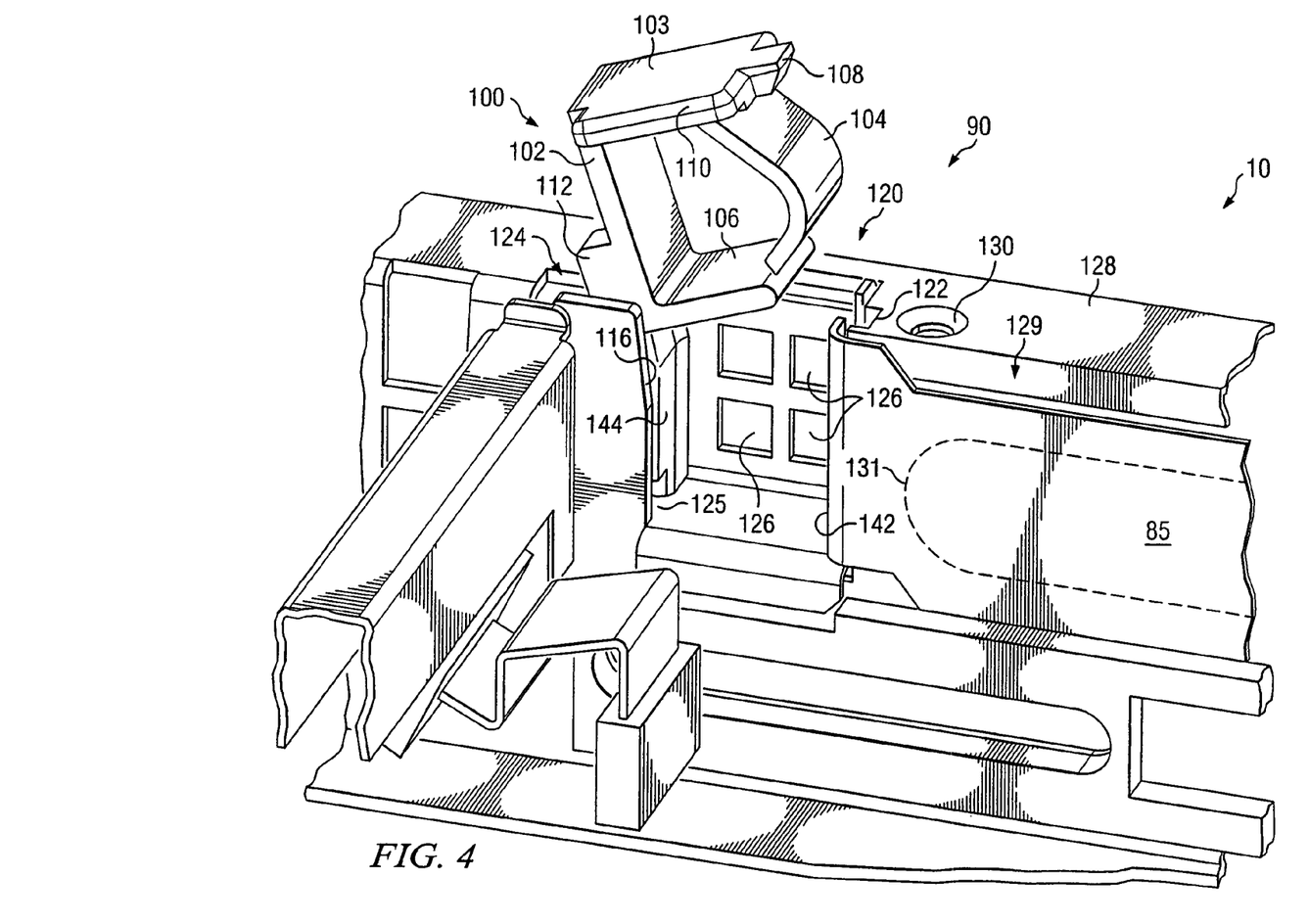
FIG. 4 illustrates a bracket of a computer component and a portion of a chassis component having a frame and a retaining clip in a disengaged position, according to teachings of the present disclosure.

Retaining clip 100 includes back wall member 102, top wall member 103 and spring member 104. Back wall member 102 generally formed on an opposing end from the acting force of spring member 104. Back wall portion 102 may include latch member 114 and guide rail 112. Guide rail 112 typically interacts with a slot formed on chassis component 128 such as guide slot 124 as shown in FIG. 4. Latch member 114 maintains retaining clip 100 to a portion of chassis component 128 to prevent accidental removal or disassociation of retaining clip 100 from chassis component 128.

Tab or foot tab 106 may be formed to extend from back wall member 102. Foot tab 106 is formed along the edge of back wall member 102 opposite from the edge connected to top wall member 103. Foot tab 106 prevents the engagement of retaining clip 100 when flange 87 is not in the correct position of frame 120. Typically, flange 87 when not in the correct position has a tendency to displace between back wall member 102 and spring member 104. Tab or foot tab 106 prevents the engagement of retaining clip 100 if flange 87 is displaced or possibly in the wrong position.

Top wall member 103 connects back wall member 102 to spring member 104. Typically, top wall member 103 is arranged to sit flush with the top of chassis component 0.128 in the engaged position. Top wall member 103 may include finger pull 110 and pin 108. Finger pull 110 is formed as a part of top wall member 103 such that a portion of top wall member 103 extends to provide a user easy surface to grip when moving retaining clip 100. Typically, pin 108 extends from top wall member to engage chassis component 128 at notch 122 (shown below in more detail) and/or to engage with screw slot 88 to prevent removal when retaining clip 100 is placed in the engaged position.

Spring member 104 extends from top wall member 103 in a curved orientation. Spring member is made to deflect in a direction towards back wall member 102 when placed against flange 87 in frame 120. The deflection of spring member 104 provides a force such as a compressive force to retain flange 87 between spring member 104 and a wall of frame 120 (as described below). Typically, the force is directly proportional to the displacement of spring member 106. In some embodiments, retaining clip 100 secures two or more flanges 85 from different computer components 80 with chassis component 128. As such, retaining clip may include one or more spring members 106 for each flange 85 or may use one spring member for two or more flanges 85 of the different computer components.

FIG. 1 illustrates a portion of chassis component 128 having frame 120 and retaining clip 100 in a disengaged position with bracket 85 of computer component 80 (note that only bracket 85 is shown for clarity). Chassis component 128 includes panel 129 having an aperture 131 formed therein. Aperture 131 provides and maintains access to computer component 80 such as allowing access to I/O ports 86 mounted on bracket 85 when coupled to panel 129 of chassis component 128.

In order to secure computer component 80 to information handling system 10, chassis component 128 includes retaining clip 100 and frame 120. Frame 120 is formed adjacent aperture 131 and is designed to receive a portion of bracket 85, typically flange 87. Retaining clip 100 is designed to be inserted into frame 120 such that flange 87 is secured between frame 120 and retaining clip 100. Frame 120 may include a variety of shapes or designs but typically is formed in a rectangular shape.

Usually, frame 120 is formed from one or more portions of chassis component 128. Generally, frame 120 is an open structure operable to receive retaining clip 100. As such, frame 120 may be formed from first side wall 142 set opposing second side wall 144.

First side wall 142 may be sized and designed to receive flange 87 such that when retaining clip 100 is engaged, computer component 80 is secured. In some embodiments, first side wall 142 may include notch 122 that is operable to receive pin 108 to further secure computer component 80 via flange 87.

Second side wall 144 is generally set opposing first side wall 142 such that retaining clip 100 is set between first and second wall 142 and 144. Typically, the amount of space set between the walls, including the addition of flange 87, is less than the distance from back wall member 102 to the apex of the arc on spring member 104. As such, the process of engaging retaining clip 100 into frame 120 causes the force, such as compression force, in spring member 104.

To aid in sliding retaining clip 100 between an engaged position and a disengaged position, second side wall 144 includes guide slot 124. Guide slot 124 is operable to receive guide rail 112 to aid in the movement or sliding of retaining clip 100 into frame 120. In certain embodiments, guide slot 124 extends onto an upper or top portion chassis component 128 to allow retaining clip 100 to be placed in a disengaged or storage position. To facilitate moving retaining clip 100 to the disengaged position, chamfer 116 may be formed along second side wall 144. Chamfer 116 creates a slight angle away from frame 120 to allow retaining clip 100 to orient into a storage position while remaining in guide slot 124.

In some embodiments, second side wall 144 includes latch opening 125. Latch opening 125 is generally formed along guide slot 124. Latch opening 125 is sized such that latch 114 can be inserted therethrough to maintain retaining clip 100 to chassis component 128.

Frame 120 includes vent holes 126, which are generally aligned parallel to chassis component 128. Vent holes 126 provide a passageway for air to pass through chassis component 128. The passageway allows for airflow to move though information handling system 10 via chassis component 128. Due to the low profile or cross section design of retaining clip 100, the resistance to the airflow moving through chassis component 128 via frame 120 through retaining clip 100 is substantially reduced.

Figure 5:
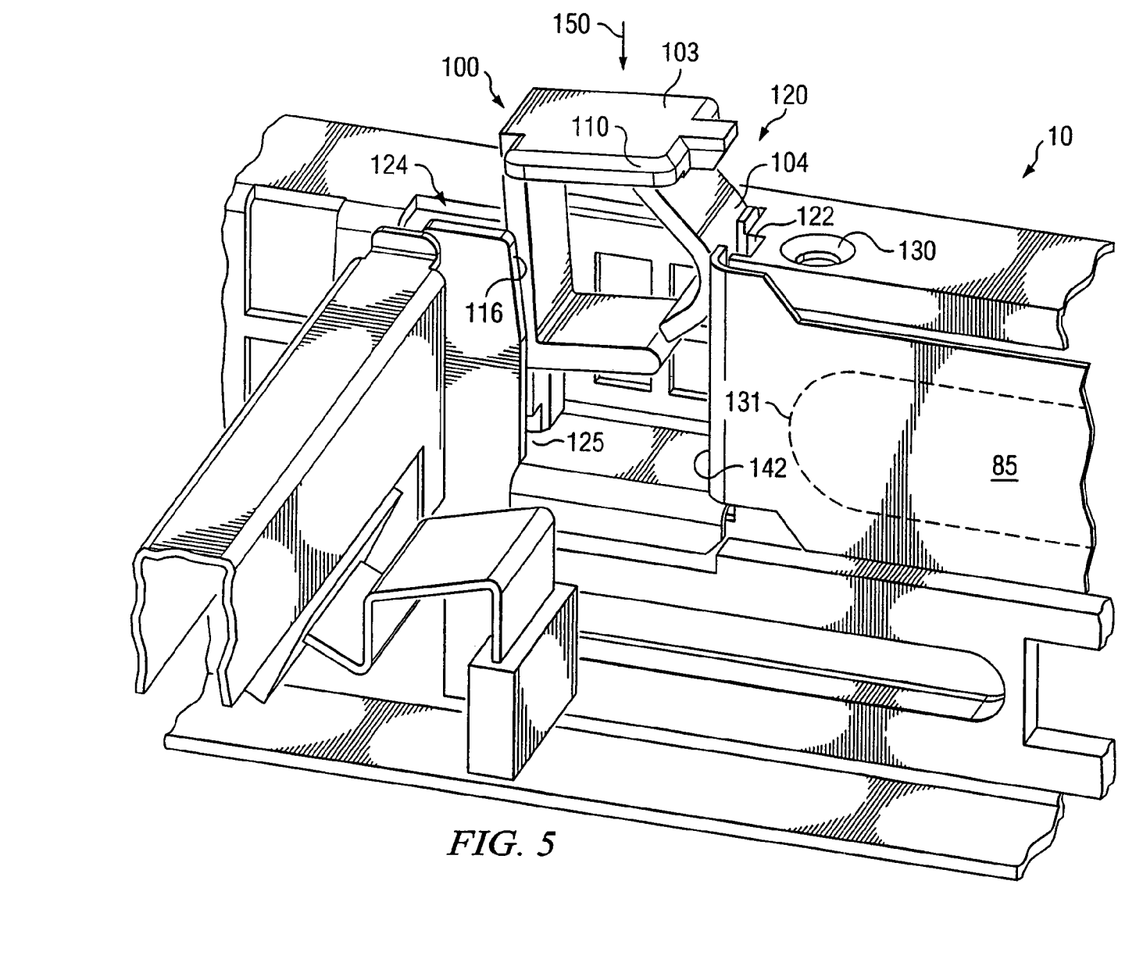
FIG. 5 illustrates a portion of the chassis component with the retaining clip partially engaging the flange of bracket, according to teachings of the present disclosure.

FIG. 5 illustrates a portion of chassis component 128 with retaining clip 100 partially engaging flange 87 of bracket 85. Retaining clip 100 is inserted into frame 120 by sliding guide rail 112 along guide slot 124 in direction 150.

The partially inserted retaining clip 100 begins to resist the movement due to spring member 104 contacting flange 87 positioned next to first wall member 142. As such, spring member 104 deflects towards back wall member 102 to apply a force against flange 87.

Figure 6:
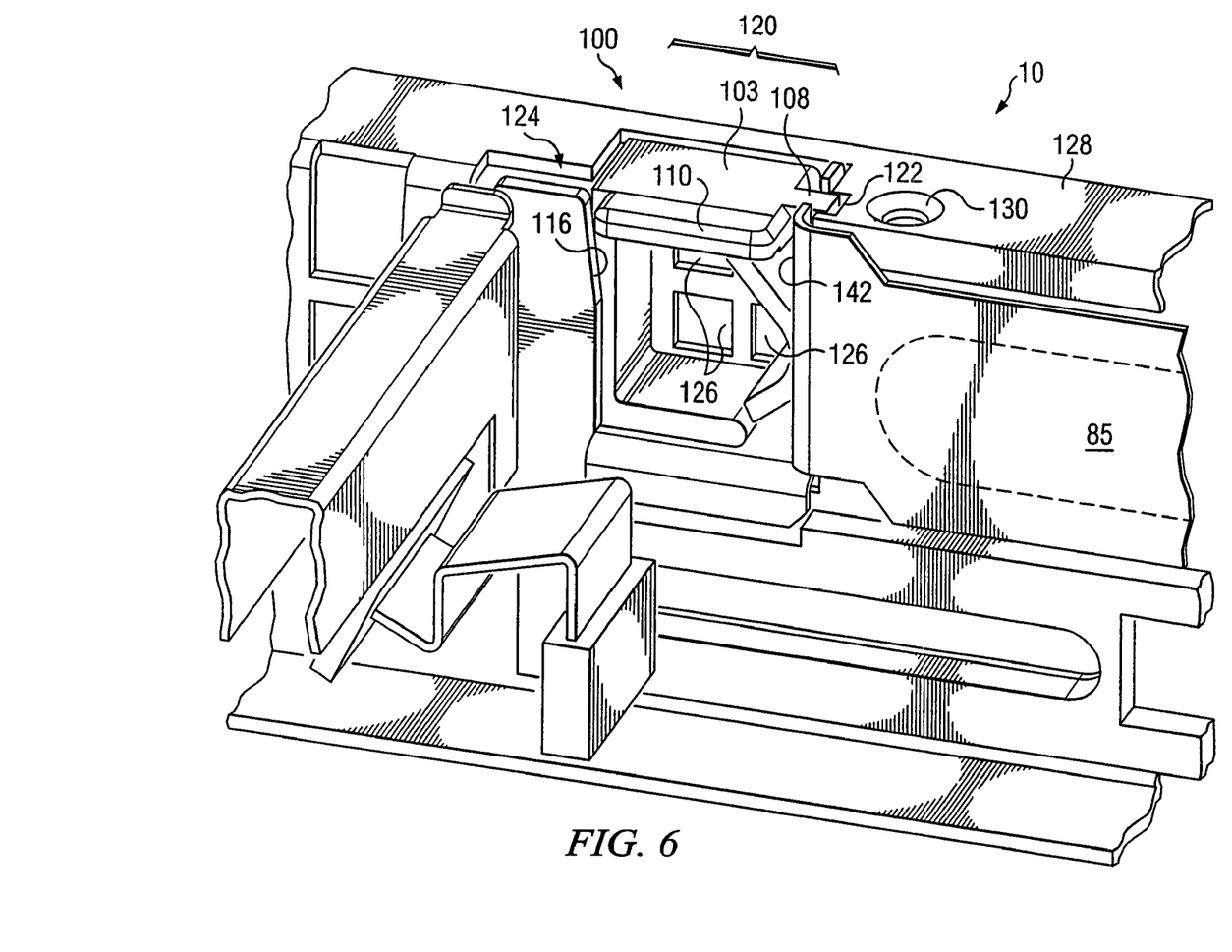
FIG. 6 illustrates the retaining clip fully engaging the flange to secure the computer component to the chassis component, according to teachings of the present disclosure.

FIG. 6 illustrates retaining clip 100 fully engaging flange 87 to secure computer component 80 to chassis component 128. In the seated or fully engaged position, retaining clip 100 applies a sufficient force against flange 87 to secure computer component 80 to chassis component 128.

In some embodiments, in the fully engaged position, top wall member 103 is approximately flush with or embedded into the surface of chassis component 128. As such, a cover panel (not shown) or other component may be coupled over top wall member 103 to prevent removal or movement of retaining clip 100. In one instance, a cover panel is secured to chassis component 128 with a screw inserted at screw hole 130. With the cover panel secured to chassis component 128, movement of retaining clip 100 is prevented such that computer component 80 is secured to chassis component 128.

In the fully inserted position, the low cross section or low profile design of retaining clip 100 is readily apparent, especially if a top cover plate is attached to chassis component 128. An open airway is created between top wall member 103, side wall member 102, foot tab 106 and spring member 104. The airway allow for airflow through retaining clip 100 and vent holes 126. As such, retaining clip 100 allows for airflow through frame 120 with minimal friction loss or resistance.

Figure 7A:
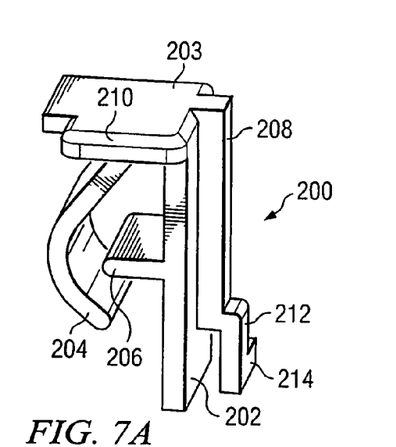
FIGS. 7A and 7B illustrate perspective views of a retaining clip, according to teachings of the present disclosure.
Figure 7B:
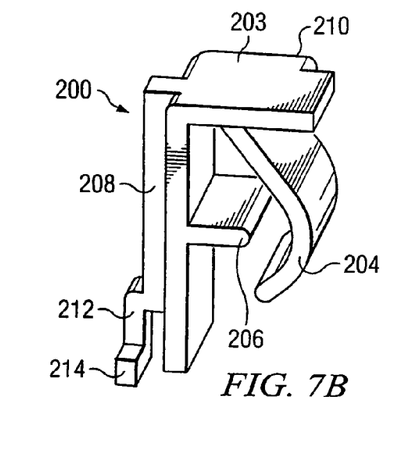

FIGS. 7A and 7B illustrate perspective views of retaining clip 200. Another example of a low profile or cross section retaining clip is retaining clip 200. Retaining clip 200, while similar to retaining clip 100, includes side wall 202, top wall 203 and spring member 204, arranged to have a low profile or low cross section design.

Top wall 203 is similar to top wall member 103 and typically becomes flush with an upper or top portion of chassis component 228 in an engaged position. Top wall 203 may include finger pull 210. Side wall 202 is similar to side wall member 102. In some embodiments, side wall 202 includes include rib 208, guide rail 212 and latch 214. Middle tab 206 is another example of a tab that prevents the engagement of retaining clip 200 if flange 87 is out of the proper orientation. Similarly, spring member 204 applies a force against flange 87 to secure bracket 85 to chassis component 128.

Figure 8:
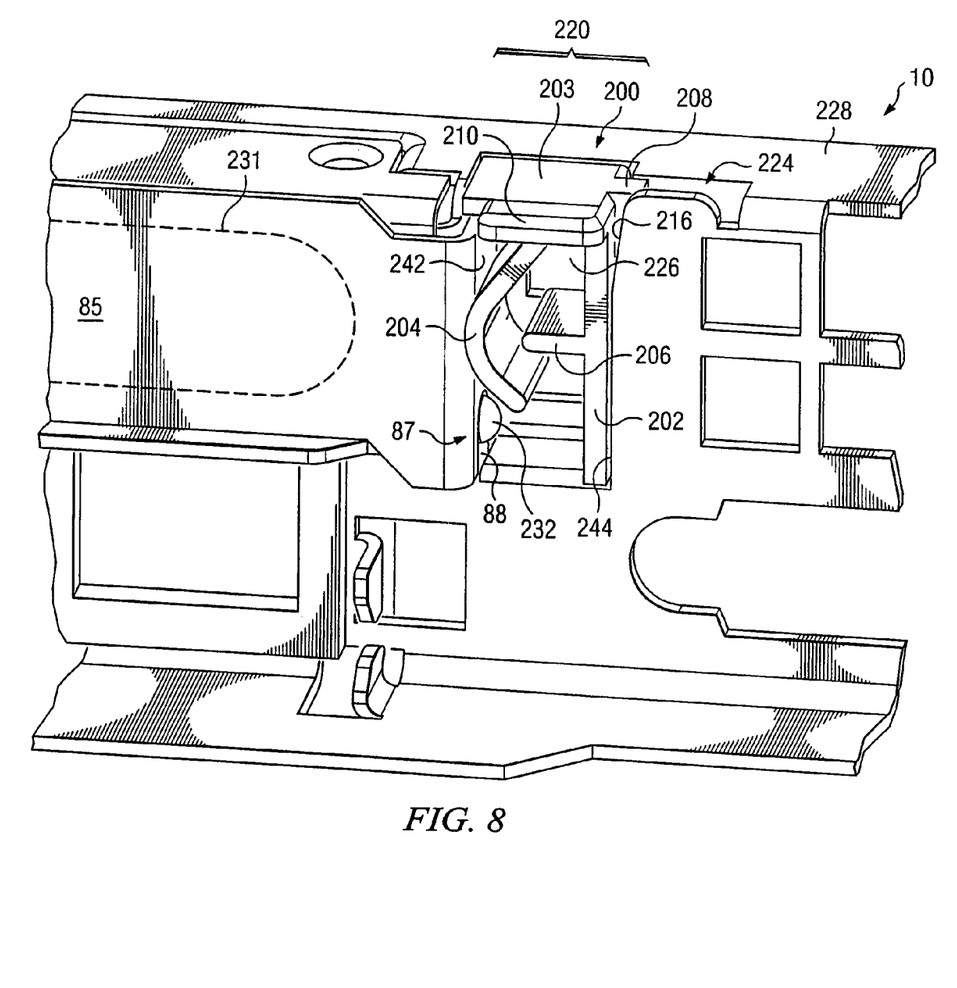
FIG. 8 illustrates another retaining clip inserted into a frame to secure a flange of a bracket, according to teachings of the present disclosure.

FIG. 8 illustrates retaining clip 200 inserted into frame 220 to secure flange 87 of bracket 85. Frame 220 is similar to frame 120 in that flange 87 is positioned in frame 220 adjacent aperture 231. Frame 220 includes first wall 242 and second wall 244. Frame 220 may include dimple 232 typically formed along first wall 242.

Dimple 232 aids in securing bracket 85 to chassis component 128. Bracket 85, in some orientations, may position screw slot 88 at the bottom part of frame 220 such that screw slot 88 cannot be retained with a feature such as pin 108 on retaining clip 100. As such, dimple 232 interacts with screw slot 88 to prevent flange 87 from being removed from frame 220 in the engaged position.

In some embodiments, rib 208 may be used in conjunction with guide rail 212 to move/slide along a portion of guide slot 224. In addition guiding the movement of retaining clip 200, rib 208 and guide rail 212 may further prevent removal of retaining clip 200 while in the engaged position. As such, rib 208 interlocks with a portion of guide slot 224 to prevent lateral movement of retaining clip 200.

Lastly, vent holes 226 are formed in frame 220 to allow air to flow through chassis component 128. Similar to retaining clip 100 formed in frame 120, the low profile or low cross section design of retaining clip 200 in frame 220 substantially reduces the resistance of airflow flowing therethrough.

Although the disclosed embodiments have been described in detail, it should be understood that various changes, substitutions and alterations can be made to the embodiments without departing from their spirit and scope.

What is claimed is:

1. An apparatus for securing a computer component to a chassis comprising:
   a retaining clip sized to selectively engage a portion of a chassis frame and movable between an engaged position and a disengaged position with respect to the chassis frame;
   the retaining clip oriented and designed to permit airflow through the retaining clip and the chassis frame while the retaining clip is in the engaged position; and
   a spring member operably extending from a portion of the retaining clip, the spring member operable to engage a computer component bracket to secure the computer component to the chassis frame in the engaged position and operably permit removal and installation of the computer component in a disengaged position.

2. The apparatus of claim 1, wherein the retaining clip further includes a cross section design having a low profile oriented.

3. The apparatus of claim 1, wherein the retaining clip is made of plastic, metal or a combination thereof.

4. The apparatus of claim 1, wherein the retaining clip further comprises a guide rail slidable within a guide slot formed within the chassis frame.

5. The apparatus of claim 1, wherein the retaining clip further comprising a tab operable to prevent the retaining clip from moving to the engaged position if the bracket is in an improper position.

6. The apparatus of claim 1, further comprising the retaining clip formed to align with a vent hole formed on a side of the chassis frame for providing airflow therethrough.

7. The apparatus of claim 1, further comprising a chamfer formed on one edge of the chassis frame, the chamfer operable to allow the retaining clip to move to a retracted orientation while in the disengaged position.

8. The apparatus of claim 1, further comprising a finger pull formed on the retaining clip, the finger pull operably permits movement of the retaining clip without tools by a user.

9. The apparatus of claim 1, further comprising a pin formed on the retaining clip, the pin operable to interact with a notch formed in the chassis frame, when the retaining clip is moved to the engaged position such that the retaining clip resists movement in a lateral direction.

10. A method comprising:
    providing a chassis for an information handling system;
    forming an aperture within a panel within the chassis operable to maintain access to a computer component having a bracket;
    providing a frame within the chassis formed adjacent the aperture and operable to receive a portion of the bracket;
    coupling a retaining clip to the frame, the retaining clip movable between an engaged position and a disengaged position;
    orienting the retaining clip in the engaged position to permit airflow through the retaining clip and the frame; and
    providing a spring member operably extending from a portion of the retaining clip operable to engage the bracket to secure the computer component to the chassis component in the engaged position and operable to permit removal and installation of the computer component in the disengaged position.

11. The method of claim 10 further comprising:
    providing a printed circuit board having a computer component slot, the computer component slot operable to electrically couple the computer component to the printed circuit board;
    at least one processor operably coupled to the printed circuit board; and
    a memory operably coupled to the processor and the printed circuit board.

12. The method of claim 10 wherein providing the chassis further comprises providing a cover plate coupled to a side of the chassis adjacent the chassis component such that the cover plate, when coupled to the chassis, retains the retaining clip.

13. The method of claim 10 further comprising providing a system fan associated with the chassis operable to generate airflow through the chassis.

14. The method of claim 10 further comprising providing a vent hole formed in the frame for provides passage of airflow through the frame of the chassis.

15. The method of claim 10 wherein the retaining clip further includes a low profile cross section for reducing airflow restriction of air moving through the retaining clip.

16. The method of claim 10 further comprising:
    providing a guide slot formed along one side of the frame; and
    forming a guide rail on the retaining clip for slidable interfacing with the guide slot when the retaining clip moves between the engaged position and the disengaged position.

17. The method of claim 10 further comprising sizing the retaining clip and frame to receive two or more brackets from respective computer components.

18. The method of claim 11 wherein the computer component comprises a peripheral component interface (PCI) card and the computer component slot comprises a PCI card slot.

19. A method comprising:
providing a retaining clip sized to selectively engage a portion of a chassis frame in an engaged position, and sized to be removed from the chassis frame in a disengaged position;
orienting the retaining clip to permit airflow through the chassis frame and the retaining clip; and
providing a spring member operably extending from a portion of the retaining clip, the spring member operable to engage a computer component bracket to secure the computer component to the chassis frame in the engaged position and operably permit removal and installation of the computer component in a disengaged position.

20. The method of claim 19 further comprising aligning the retaining clip with a vent hole formed on a side of a chassis frame for providing airflow through the vent hole and the retaining clip.

* * * * *